United States Patent [19]

Pitkanen

[11] Patent Number: 5,489,834
[45] Date of Patent: Feb. 6, 1996

[54] BATTERY TYPE AND TEMPERATURE IDENTIFICATION CIRCUIT

[75] Inventor: Risto Pitkanen, Vaskio, Finland

[73] Assignee: Nokia Mobile Phones Ltd., Salo, Finland

[21] Appl. No.: 62,929

[22] Filed: May 17, 1993

[30] Foreign Application Priority Data

May 25, 1992 [FI] Finland ................................. 922386

[51] Int. Cl.⁶ ............................ H02P 9/04; H02P 11/00
[52] U.S. Cl. ................................... 320/15; 320/39
[58] Field of Search ................... 320/35, 15, 2, 320/17

[56] References Cited

U.S. PATENT DOCUMENTS

| | | | |
|---|---|---|---|
| 3,667,026 | 5/1972 | Bogut et al. | 320/36 |
| 4,006,396 | 2/1977 | Bogut | 320/2 |
| 4,746,852 | 5/1988 | Martin | 320/20 |
| 5,063,340 | 11/1991 | Kalenowsky | 320/1 |
| 5,153,496 | 10/1992 | LoForge | 320/17 |
| 5,252,906 | 10/1993 | Busson | 320/22 |
| 5,309,080 | 5/1994 | Odendahl et al. | 320/35 |
| 5,332,957 | 6/1994 | Lee | 320/2 |

FOREIGN PATENT DOCUMENTS

| | | |
|---|---|---|
| 922386 | 11/1993 | Finland. |
| WO91/08604 | 6/1991 | WIPO. |

Primary Examiner—Steven L. Stephan
Assistant Examiner—Nicholas Ponomarenko
Attorney, Agent, or Firm—Perman & Green

[57] ABSTRACT

A battery identification circuit for determining the temperature and the type of a battery used in an electrical apparatus such as a portable radio telephone. The temperature and the type of a battery of the apparatus are measured with the help of an analog to digital converter. The voltage specifying the temperature is scaled to different voltage levels according to the type of battery. The temperature measurement algorithm is selected according to the present voltage level. The battery temperature is detected by measuring the voltage drop across a negative temperature coefficient (NTC) first resistor. The measured voltage is scaled to different levels by a second resistor to provide an identification of the battery type.

4 Claims, 3 Drawing Sheets

BATTERY TYPE AND TEMPERATURE IDENTIFICATION CIRCUIT

This invention related to a battery circuit. In particular the invention relates to a circuit for determining battery temperature and type.

BACKGROUND OF THE INVENTION

The circuit enables the determination of the temperature and the type of a battery i.e. the capacity of a battery. The information on the temperature and the capacity of a battery is required for the charging algorithm of an electrical apparatus such as a portable radio telephone with which the battery is to be used to ensure efficient and safe charging of the battery.

In a prior art circuit the temperature and battery type are measured from two distinct voltages, that is from measuring the voltage drop across two distinct resistance means. For this, two different physical connections between the battery and the electrical apparatus such as a portable radio telephone and two channels from the A/D converter of the electrical apparatus are required.

The prior art is described with reference to the accompanying drawings, in which:

FIG. 1 is a diagram of a prior art battery circuit; and

FIG. 2 is a diagram of a temperature curve indicative of the circuit described in FIG. 1.

The diagram shown in FIG. 1 is a circuit diagram of a prior art circuit. The temperature of the battery 1 is detected by measuring the voltage over the Negative Temperature Coefficient (NTC) resistor 2 in the battery 1 with the aid of the Analog to Digital (A/D) converter. The type of the battery 1 is determined likewise by measuring the voltage over the resistor 3 in the battery 1 with the aid of the A/D converter. The resistors used in the measurement have been marked with the numbers 4 and 5.

The diagram shown in FIG. 2 is a diagram of a temperature detection curve corresponding to the circuit described in FIG. 1. The relationship between the temperature of the battery 1 and the voltage measured over the NTC resistor 2 is described by tile curve 6. In addition, the value of the resistor 3 is selected depending on the type of the battery 1. Generally there are two to three different types of battery.

In the prior art circuit two different physical connections between the battery and the portable radio telephone and two channels from the A/D converter of the potable radio telephone are required.

SUMMARY OF THE INVENTION

According to the present invention there is provided a circuit for determining the temperature and type of a battery selected from a plurality of battery types, the circuit comprising a temperature dependent resistance means, means for producing a voltage drop across the resistance means, the magnitude of said voltage drop being indicative of the battery temperature, and means for shifting the voltage drop by one of a plurality of predetermined voltages each predetermined voltage corresponding to one of said plurality of battery types such that both the battery temperature and battery type can be determined from the magnitude of the voltage drop.

An advantage of this invention is to accomplish an improvement in detection of the temperature and the type of a battery with the help of which the previously mentioned problems could be solved. Also the circuit requires only one connection between the battery and the electrical apparatus.

BRIEF DESCRIPTION OF THE DRAWINGS

An embodiment of the present invention is described below, by way of example, with reference to the accompanying drawings in which.

DETAILED DESCRIPTION OF THE INVENTION

Figure 1:
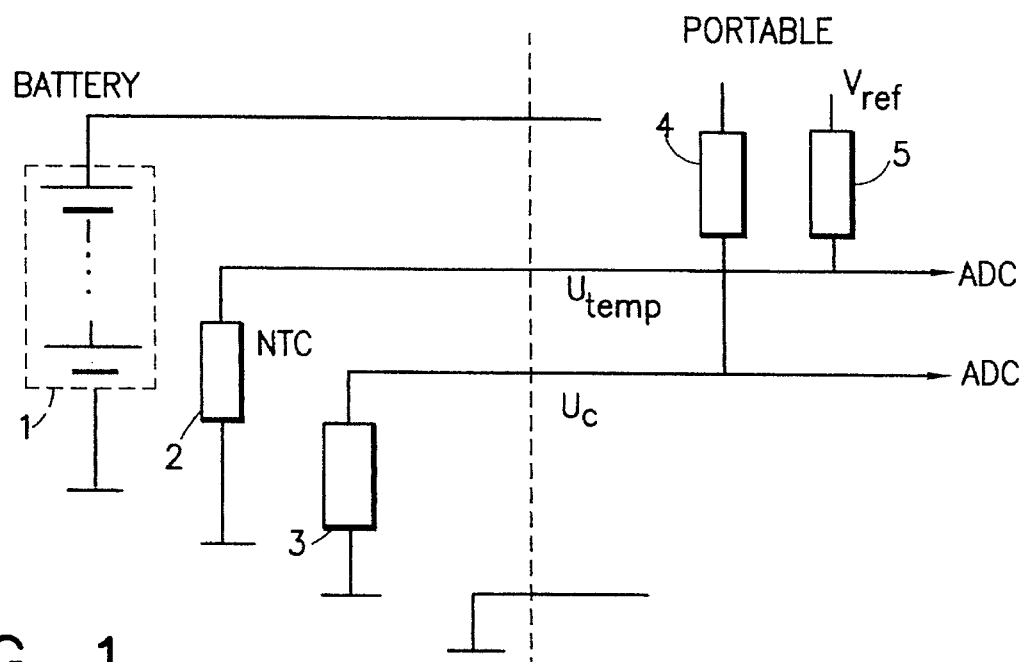
FIG. 1 is a schematic diagram of a prior art battery circuit.
Figure 2:
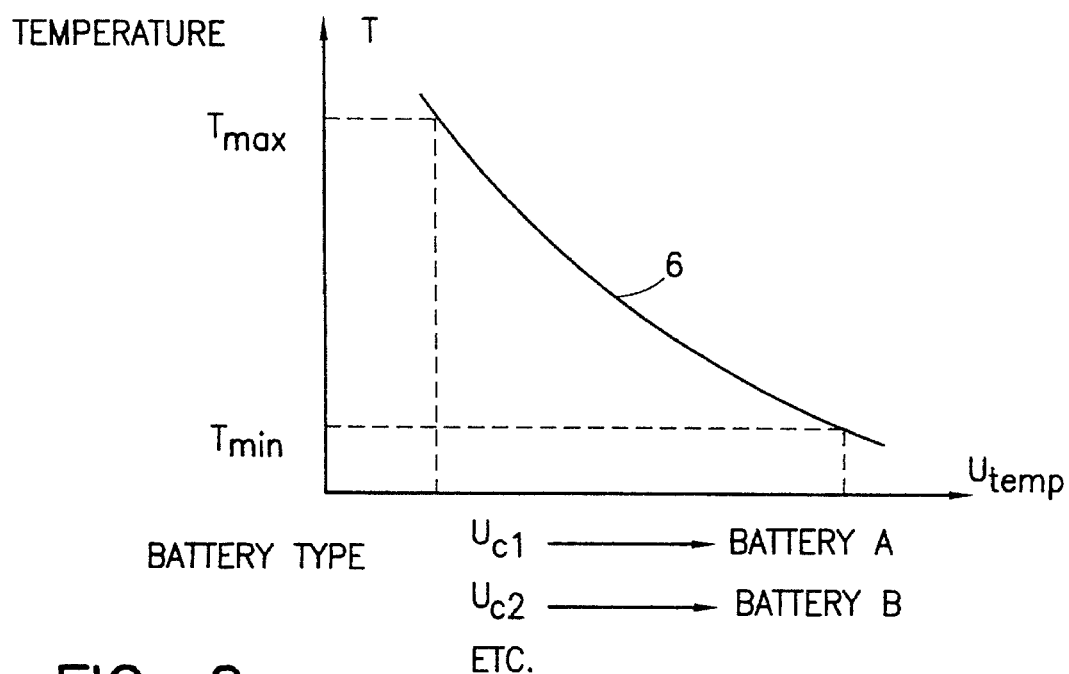
FIG. 2 is a diagram of a temperature curve indicative of the circuit shown in FIG. 1.
Figure 3:
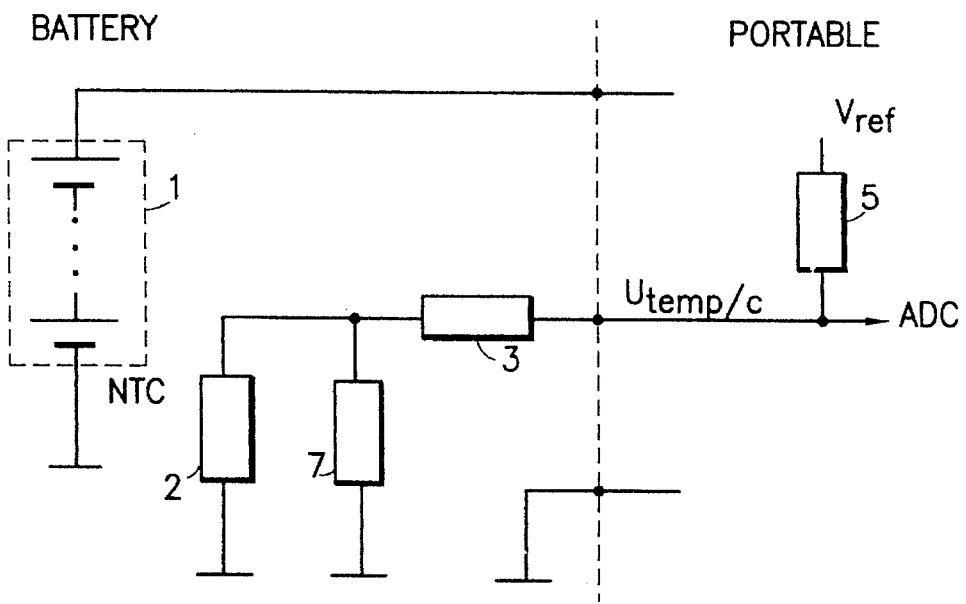
FIG. 3 is a diagram of a circuit in accordance with the present invention.

FIG. 3 is a diagram of a battery identification circuit in accordance with the present invention. In the circuit the temperature of the battery 1 is detected by measuring the voltage drop across the NTC first resistor 2 with the help of the A/D converter. The voltage measured with the A/D converter is scaled to different levels by second resistor 3 depending on the type of the battery 1. The aforesaid voltage over the NTC resistor 2, representative of the temperature of the battery 1, is an analog voltage. When the analog voltage over the NTC resistor 2 is applied to the A/D converter, a digital signal representative of the analog signal is produced and one skilled in the art knows that indicator circuits for indicating the value of a digital signal are well known and readily available in the art. The temperature measurement algorithm is selected depending on the present voltage level. For example, in the circuit presented in the figure the measurement range is dimensioned and the variation range restricted with the third resistor 7. The value of the second resistor 3 depends on the type of the battery 1. The resistor used in the measurement has been marked with the number 5.

Figure 4:
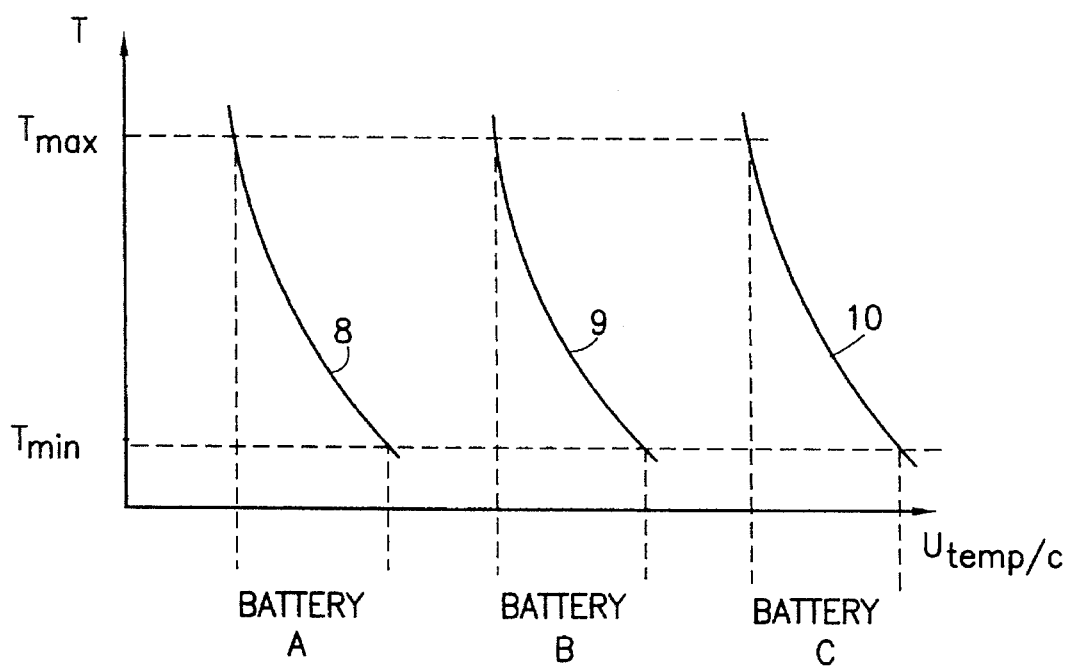
FIG. 4 is a series of temperature curves corresponding to the circuit of FIG. 3.

The diagram shown in FIG. 4 is a series of temperature curves indicative of the circuit in FIG. 3 for determining the temperature and the type of a battery in accordance with the present invention. When battery type "A" is used, the relationship between the temperature of the battery 1 and the voltage measured over the NTC first resistor 2 is described by curve 8. Accordingly, when battery types "B" and "C" are used, the relationship between the temperature of the battery 1 and the voltage measured over the NTC first resistor 2 is described with curves 9 or 10 respectively.

Because there is only one voltage measured only one connection between the battery 1 and the hand portable telephone and only one channel from the A/D converter of the hand portable telephone is required.

Figure 5:
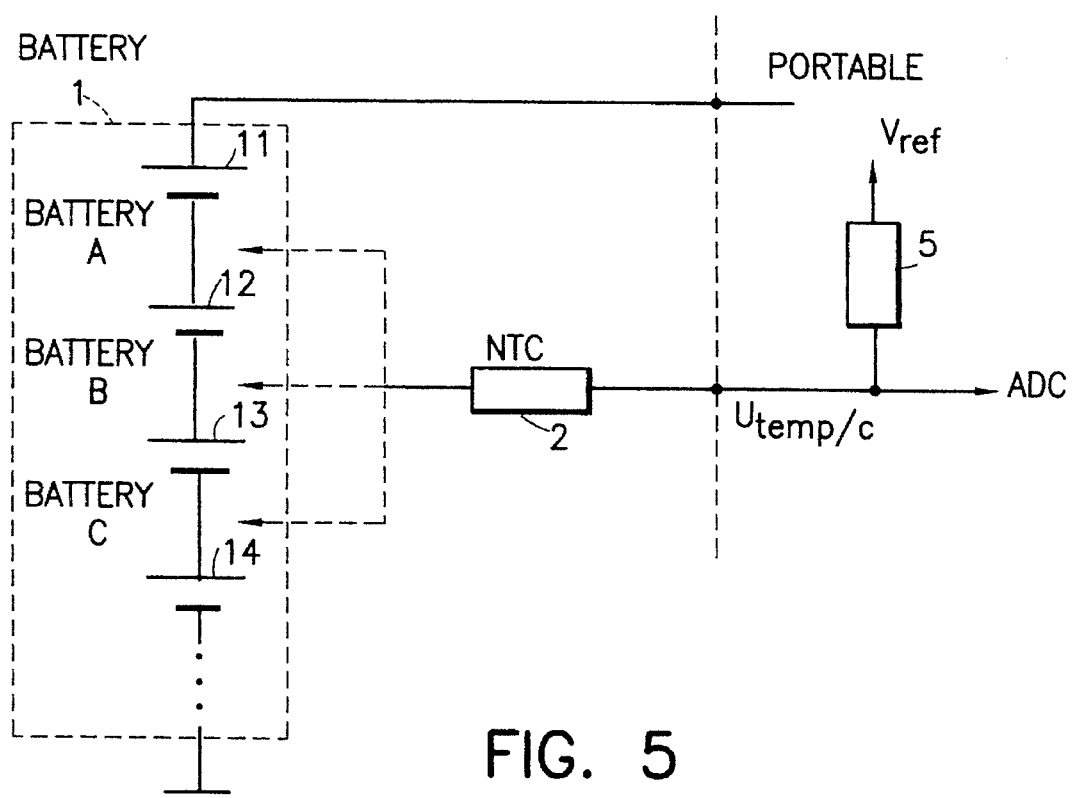
FIG. 5 is a diagram of an alternative circuit in accordance with the present invention.

The diagram shown in FIG. 5 is a circuit diagram of an alternative solution according to the present invention. In the circuit of FIG. 5 battery 1 includes a plurality of output terminals and the first the NTC resistor 2 is coupled to different voltages in the battery 1, that is to different terminals in the cells 11 to 14, depending on the type of battery in use. The resistor used in the measurement has been marked with the number 5.

In view of the foregoing it will be clear to a person skilled in the art that modifications may be incorporated without departing from the scope of the present invention.

What we claim is:

1. A battery identification circuit for determining the temperature and type of a battery selected to be identified includes a plurality of battery types, the circuit comprising a temperature dependent first resistance means, circuit means connected to said first resistance means and to a battery to be identified for producing a voltage drop across said first resistance means, the magnitude of said voltage drop being indicative of the battery temperature, and said circuit means including second resistance means for shifting the voltage drop by one of a plurality of predetermined voltages, each predetermined voltage shifts corresponding to one of said plurality of battery types such that both the battery temperature and battery type can be determined from the magnitude and shift of said voltage drop, said battery to be identified includes a plurality of output terminals and wherein the temperature dependent first resistance means is coupled to one of said plurality of output terminals corresponding to a plurality of cells of the battery, depending on the battery type.

2. A circuit as claimed in claim 1, wherein said circuit means includes a second resistance means, and wherein the temperature dependent resistance first means is coupled in series to said second resistance means, the magnitude of the series second resistance means being dependent on the type of battery, and the series second resistance means being substantially greater in magnitude than the maximum resistance of the temperature dependent resistance means.

3. A circuit as claimed in claim 2, wherein said circuit means includes a third resistance means is coupled in parallel with the temperature dependent first resistance means to restrict the variation range of the total resistance of the circuit.

4. A circuit as claimed in claim 1, wherein said first resistance means is a Negative Temperature Coefficient (NTC) resistor.

* * * * *